United States Patent
Walker

(10) Patent No.: US 9,236,853 B2
(45) Date of Patent: Jan. 12, 2016

(54) DIGITAL DUTY CYCLE CORRECTION

(71) Applicant: FUJITSU LIMITED, Kawasaki-shi, Kanagawa (JP)

(72) Inventor: William W. Walker, Los Gatos, CA (US)

(73) Assignee: FUJITSU LIMITED, Kawasaki (JP)

(*) Notice: Subject to any disclaimer, the term of this patent is extended or adjusted under 35 U.S.C. 154(b) by 144 days.

(21) Appl. No.: 14/172,758

(22) Filed: Feb. 4, 2014

(65) Prior Publication Data
US 2015/0222254 A1 Aug. 6, 2015

(51) Int. Cl.
| | |
|---|---|
| *G01R 27/26* | (2006.01) |
| *H03K 3/017* | (2006.01) |
| *H03K 7/08* | (2006.01) |
| *H03K 5/05* | (2006.01) |
| *H03K 21/00* | (2006.01) |
| *H03K 5/156* | (2006.01) |
| *H03K 19/00* | (2006.01) |
| *H03K 5/04* | (2006.01) |
| *G01R 27/02* | (2006.01) |
| *G01R 15/16* | (2006.01) |

(52) U.S. Cl.
CPC .................. *H03K 5/05* (2013.01); *H03K 3/017* (2013.01); *H03K 5/1565* (2013.01); *H03K 7/08* (2013.01); *H03K 19/0016* (2013.01); *H03K 21/00* (2013.01); *G01R 15/16* (2013.01); *G01R 27/02* (2013.01); *G01R 27/2605* (2013.01)

(58) Field of Classification Search
CPC ....... H03K 5/1565; H03K 3/017; H03K 7/08; H03K 19/0016; H02M 3/156; G01R 27/2605; G01R 27/02; G01R 15/16
USPC ........... 324/73, 459, 600, 649, 658, 676, 678; 327/175
See application file for complete search history.

(56) References Cited

U.S. PATENT DOCUMENTS

| | | | |
|---|---|---|---|
| 6,958,639 B2 | 10/2005 | Park et al. | |
| 8,923,462 B2* | 12/2014 | Choi | H04L 25/4902 327/175 |
| 8,970,230 B2* | 3/2015 | Narayanasamy | H03K 17/962 324/658 |
| 2011/0267127 A1* | 11/2011 | Staszewski | H03F 3/2176 327/306 |
| 2014/0250160 A1* | 9/2014 | Ihor | G06F 7/588 708/251 |

OTHER PUBLICATIONS

T. Lin and C. Chi, A 70-490 MHz 50% Duty-Cycle Corrector Circuit in 0.35μm CMOS, 2006 Asian Solid State Circuits Conference, p. 91-94.
M. Thomson, P. Restle, N. James, A 5GHz Duty-Cycle Correcting Clock Distribution Network for the POWER6 Microprocessor, ISSCC, Feb. 7, 2006, paper 21.3.

(Continued)

*Primary Examiner* — Jermele M Hollington
*Assistant Examiner* — Raul Rios Russo
(74) *Attorney, Agent, or Firm* — Maschoff Brennan

(57) ABSTRACT

A digital duty-cycle correction circuit may include an adjustment unit that may be configured to adjust a duty cycle of an oscillating signal based on an adjust signal to generate an adjusted oscillating signal and a sampling unit that may be configured to sample the adjusted oscillating signal. The circuit may also include a counting unit that may be configured to generate an indication of a number of samples of the adjusted oscillating signal that are at the low and high level and to adjust the indication using a selectable duty cycle modify signal based on a desired duty cycle of the adjusting oscillating signal. The circuit may also include a comparing and filtering unit that may be configured to generate the adjust signal based on a comparison of the indication with a comparison count. The indication may be adjustable such that the oscillating signal's duty cycle is adjustable.

20 Claims, 5 Drawing Sheets

(56) References Cited

OTHER PUBLICATIONS

N. Kurd, J. Griffin, et al, A Replica-Biased 50% Duty Cycle PLL Architecture with 1x VCO, ISSCC 2003, paper 24.3. Feb. 12, 2003.
James Humble, et al. "A Clock Duty-Cycle Correction and Adjustment Circuit" ISSCC 2006 Digest of Technical Papers. San Francisco, CA. Feb. 6-9, 2006. p. 2132-2141.

T. Ogawa, et al., "A 50% duty-cycle correction circuit for PLL output" Circuits and Systems, May 2002. IEEE International Symposium on (vol. 4).
J. Ye et al "A 0.18um CMOS 10Gb/S Multichannel Transmitter with Duty-Cycle Correction", Proc. 5th Intl. Conference on ASICs, pp. 534-536, 2003.
Y. C. Jang, et al, "CMOS Duty Cycle Correction Circuit for Multi-Phase Clock", Electronics Letter, pp. 1383-1384, Sep. 18, 2003.

\* cited by examiner

US 9,236,853 B2

DIGITAL DUTY CYCLE CORRECTION

FIELD

The embodiments discussed herein are related to digital duty cycle correction.

BACKGROUND

Clock signals are commonly used in many electronic circuits and for various purposes. A clock signal may continually transition between a logic high and a logic low. The clock signal may have a duty cycle that is determined by the time duration at a logic high and the time duration at a logic low. In some circumstances, it may be desirable to generate the clock signal to have a duty cycle that is approximately equal or equal to 50%, so that the logic high duration is close to the logic low duration. A digital circuit may use both the rising and falling edges of the clock signal to trigger synchronous circuits to achieve faster operating speed. A 50% duty cycle for the clock signal may then provide the synchronous circuits with maximum timing margins.

The duty cycle of a clock signal may be distorted due to various phenomena such as mismatches in transistor devices used to generate the clock signal. Great care is often used in designing clock generation and distribution circuits to minimize device mismatches. Unfortunately, as device size shrinks in advanced integrated circuit (IC) process technologies, duty cycle distortion due to random variations and device mismatches becomes worse. Furthermore, digital circuits fabricated with advanced IC processes typically operate at high speed, e.g., one gigahertz (GHz) or higher. The high speed corresponds to a smaller clock period, e.g., 1 nanosecond (nsec) for 1 GHz. Small circuit mismatches may then translate to a relatively large error in duty cycle with the smaller clock period.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a digital duty-cycle correction circuit may include an adjustment unit that may be configured to adjust a duty cycle of an oscillating signal based on an adjust signal to generate an adjusted oscillating signal and a sampling unit that may be configured to sample the adjusted oscillating signal. The circuit may also include a counting unit that may be configured to generate an indication of a number of samples of the adjusted oscillating signal that are at the low level and at the high level and to adjust the indication using a selectable duty cycle modify signal based on a desired duty cycle of the adjusting oscillating signal. The circuit may also include a comparing and filtering unit that may be configured to generate the adjust signal based on a comparison of the indication with a comparison count. The indication may be adjustable using the duty cycle modify signal such that the duty cycle of the oscillating signal may be adjustable to more than one value.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Figure 1:
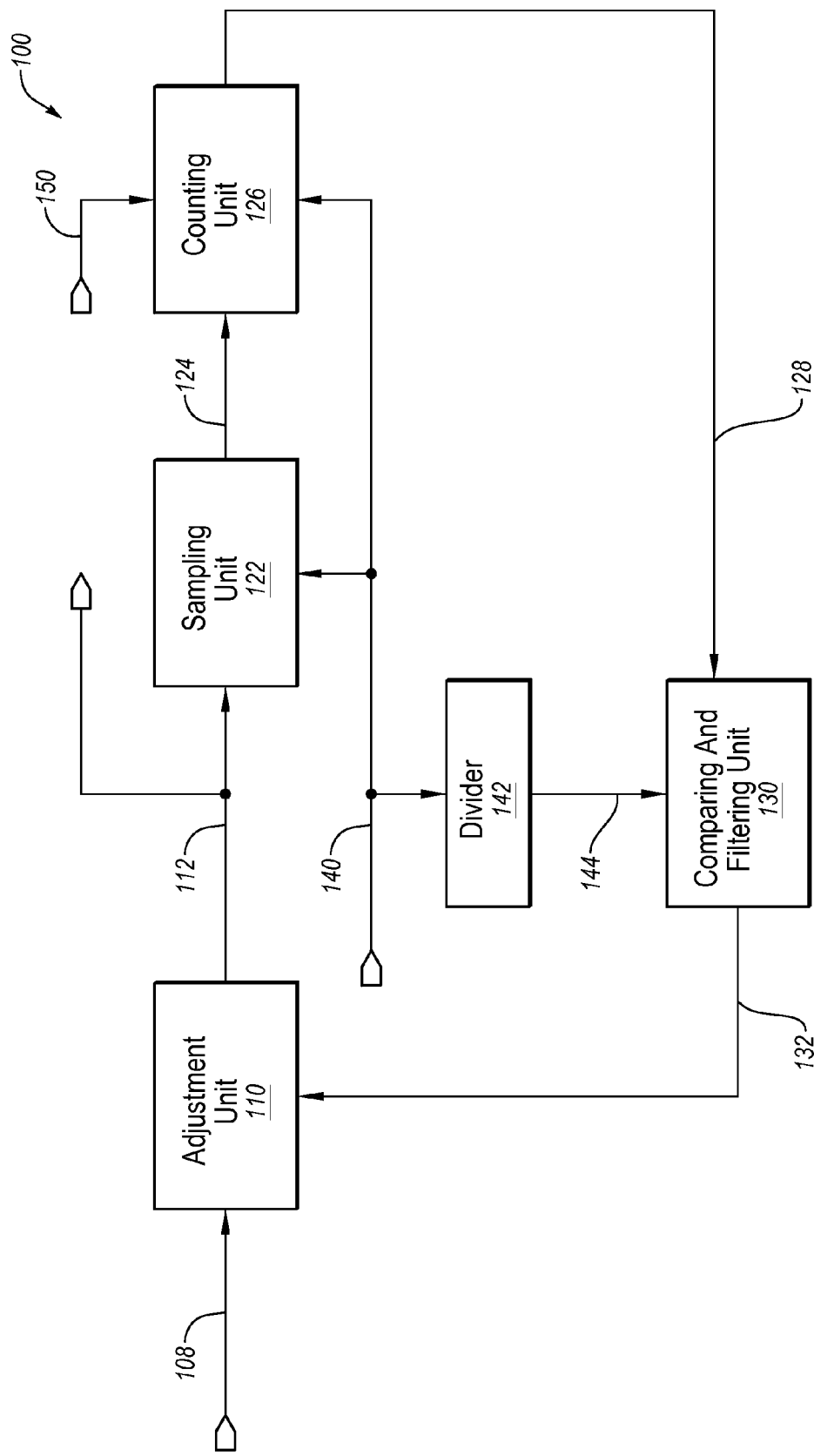
FIG. 1 is a block diagram of an example digital duty-cycle correction circuit.

According to an aspect of an embodiment, a digital duty-cycle correction circuit is disclosed that is configured to adjust a duty cycle of an oscillating signal, such as a clock signal. An oscillating signal may continually transition between a high state and a low state. The duty cycle of the oscillating signal may be a comparison between the time that the oscillating signal is at the high state and the time that the oscillating signal is at the low state. For example, a duty cycle of 50% indicates that the oscillating signal is at a high state half of the time and at a low state the other half of the time. As another example, a duty cycle of 25% may indicate that the oscillating signal is at a high state a quarter of the time and at a low state the other three-quarters of the time.

The digital duty-cycle correction circuit may be configured to automatically adjust a duty cycle of an oscillating signal to a desired value, such as 40%, 50%, 60%, or some other desired value. In some embodiments, to correct a duty-cycle of an oscillating signal, the digital duty-cycle correction circuit may sample the oscillating signal at a sampling rate that is lower than the oscillating rate of the oscillating signal. Using the samples, the digital duty-cycle correction circuit may determine an indication of a number of samples of the oscillating signal that are at the low level and a number of samples of the oscillating signal that are at the high level. This indication may be a value that may be increased when the oscillating signal is sampled and the sample is at the high level and may be decreased when the oscillating signal is sampled and the sample is at the low level. As a result, the value may be the difference between the number of samples at the high level and the number of samples at the low level. In some embodiments, the digital duty-cycle correction circuit may bias the value by increasing or decreasing the value based on a desired duty cycle of the adjusted oscillating signal.

The digital duty-cycle correction circuit may compare the value of the difference between the number of high and low level samples with a comparison count to generate an adjust signal. Using the adjust signal, the digital duty-cycle correction circuit may adjust the duty cycle of the oscillating signal. The adjusted oscillating signal may then be sampled and the operations may be performed again until the duty cycle of the oscillating signal approximates or equals the desired duty cycle. After the duty cycle of the oscillating signal approximates or equals the desired duty cycle, the digital duty-cycle correction circuit may freeze the adjust signal such that the duty cycle of the oscillating signal may continue to approximate or equal the desired duty cycle without additional jitter due to dithering of the adjust signal.

The digital duty-cycle correction circuit as configured may provide various advantages over some other duty-cycle correction circuits. For example, the digital duty-cycle correction circuit may be completely digital. As a result, the digital duty-cycle correction circuit may be scaled conveniently for a manufacturing process that generates integrated circuits that may include the digital duty-cycle correction circuit. The digital duty-cycle correction circuit may also consume a smaller footprint than mixed digital or analog duty-cycle correction circuits. Alternately or additionally, the digital duty-cycle correction circuit may be configured to adjust the duty cycle of the oscillating signal to have a duty cycle other than 50%, to freeze the adjust signal to reduce jitter in the adjusted oscillating signal, as well as to shut down portions of the digital duty-cycle correction circuit to eliminate some noise and power consumption due to the digital duty-cycle correction circuit after the duty cycle of the oscillating signal approximates or equals the desired duty cycle.

Embodiments of the present invention will be explained with reference to the accompanying drawings.

FIG. 1 is a block diagram of an example digital duty-cycle correction circuit 100 ("the circuit 100"), arranged in accordance with at least one embodiment described herein. The circuit 100 may include various components, including an adjustment unit 110, a sampling unit 122, a counting unit 126, a comparing and filtering unit 130, and a divider 142.

The adjustment unit 110 may be configured to receive an oscillating signal 108, such as a clock signal or some other signal. The oscillating signal 108 may be configured to oscillate between a low level and a high level. A ratio between the time that the oscillating signal 108 is at the high level compared to the period of the oscillating signal 108 at may be referred to as a duty cycle of the oscillating signal 108. In some embodiments, the oscillating signal 108 may be a single-ended signal or a differential signal. The adjustment unit 110 may be configured to adjust the duty cycle of the oscillating signal 108 and to output an adjusted oscillating signal 112. The adjusted oscillating signal 112 may have a desired duty cycle and may be distributed to other circuits.

The adjustment unit 110 may adjust the duty cycle of the oscillating signal 108 based on an adjust signal 132 received by the adjustment unit 110. The adjust signal 132 may indicate to the adjustment unit 110 how much to adjust the duty cycle of the oscillating signal 108. The duty cycle may be based on a ratio of the time the oscillating signal 108 is at the high level compared to the period, to increase the duty cycle of the oscillating signal 108, the adjustment unit 110 may extend the high-level portions of the oscillating signal 108 and compress the low-level portions of the oscillating signal 108. To decrease the duty cycle of the oscillating signal 108, the adjustment unit 110 may extend the low-level portions of the oscillating signal 108 and compress the high-level portions of the oscillating signal 108. In some embodiments, the adjustment unit 110 may use a complementary metal-oxide-semiconductor (CMOS) inverter topology. Alternately or additionally, the adjustment unit 110 may use other types of topologies, such as current mode logic (CML) gate topology with an imbalance between the CML gates.

The sampling unit 122 may be configured to sample the adjusted oscillating signal 112 using a clock signal 140. When sampling the adjusted oscillating signal 112, the sampling unit 122 may determine a level of the adjusted oscillating signal 112, e.g., a high level or a low level, at the rising and/or falling edge of the clock signal 140. The clock signal 140 is configured to be non-synchronous with the adjusted oscillating signal 112 such that the rising and falling edges of the clock signal 140 are uncorrelated with the rising and falling edges of the adjusted oscillating signal 112. Furthermore, the clock signal 140 may have a lower frequency than the frequency of the adjusted oscillating signal 112. As a result, the sampling rate of the sampling unit 122 may be lower than the oscillating rate of the adjusted oscillating signal 112. Having the sampling rate of the sampling unit 122 lower than the oscillating rate of the adjusted oscillating signal 112 allows the circuit 100 to operate at frequencies that are lower than the frequency of the adjusted oscillating signal 112, which may allow the circuit 100 to be less complex and consume less power.

In some embodiments, the adjusted oscillating signal 112 may include adjusted first and second complementary signals. The sampling unit 122 may be configured to sample both the adjusted first and second complementary signals. The sampling unit 122 may send a sampling signal 124 that includes an indication of the sampled levels of the adjusted oscillating signal 112 to the counting unit 126.

The counting unit 126 may be configured to generate an indication 128 of a number of samples of the adjusted oscillating signal 112 sampled by the sampling unit 122 that are at the low level and a number of samples of the adjusted oscillating signal 112 sampled by the sampling unit 122 that are at the high level based on the clock signal 140. In some embodiments, the indication 128 generated by the counting unit 126 may be a count. The count of the counting unit 126 may be set to a preselected number when the counting unit 126 is reset, powered up, or at some other time. The preselected number may be the middle number of the counting range of the counting unit 126. In some embodiments, after being set to the preselected number, during operation the count generated by the counting unit 126 may be a digital value that is decremented when the samples from the sampling unit 122 are at a low level and incremented when the samples from the sampling unit 122 are at a high level.

With the counting unit 126 increasing the count when a high level of the adjusted oscillating signal 112 is sampled and decreasing the count when a low level of the adjusted oscillating signal 112 is sampled, when the duty cycle is 50%, the count may be stabilized or dithering around the preselected number because an equal number of high-level and low-level samples of the adjusted oscillating signal 112 may be sampled by the sampling unit 122.

In some embodiments, when the adjusted oscillating signal 112 is a differential signal, the count may be increased when the first complementary signal (e.g., a positive signal of the differential signal) is sampled at the high level and the count may be decreased when the second complementary signal (e.g., a negative signal of the differential signal) is sampled at the high level.

The counting unit 126 may also be configured to adjust the indication 128 based on a selectable duty cycle modify signal 150. For example, the counting unit 126 may be configured to bypass the sampling signal 124 output by the sampling unit 122 at selected intervals, such as periodic intervals, based on a value of the duty cycle modify signal 150. When the counting unit 126 ignores or bypasses the sampling signal 124 at the selected intervals, the counting unit 126 may bias the count of the counting unit 126 by increasing or decreasing the count depending on a sign bit of the duty cycle modify signal 150.

For example, the duty cycle modify signal 150 may indicate that at selected intervals the counting unit 126 may bypass counting based on the sampling signal 124 and increase the count. Alternately, the counting unit 126 may bypass counting based on the sampling signal 124 and decrease the count. In some embodiments, the selected intervals may be based on the counting range of the counting unit 126 and may be at consistent intervals as indicated by the magnitude of the duty cycle modify signal 150. For example, when the counting range of the counting unit 126 is 256 and the count is increased or decreased based on the clock signal 140, the selected interval may be every 8, 16, 32, 64, 128, or some other number of cycles of the clock signal 140. The frequency of the selected interval that the counting unit 126 bypasses counting based on the sampling signal 124 may vary based on the duty cycle modify signal 150. For example, a higher duty cycle modify signal may cause the selected interval to be every 32 cycles of the clock signal 140 as compared to every 128 cycles of the clock signal 140. Alternately or additionally, whether the counting unit 126 increases or decreases the count may depend on a sign bit of the duty cycle modify signal 150. For example, when the sign bit of the duty cycle modify signal 150 is set to a binary 1, the count may increase at the selected interval. Alternately when the sign bit of the duty cycle modify signal 150 is set to a binary 0, the count may decrease at the selected interval.

The comparing and filtering unit 130 may be configured to compare the indication 128 from the counting unit 126 with a comparison count that is based on a counting range of the counting unit 126. For example, the comparison count may be in the middle of the counting range of the counting unit 126. In some embodiments, the comparison count may be the preselected number of the counting unit 126. The comparing and filtering unit 130 may also be configured to integrate the comparisons between the indication 128 and the comparison count. For example, the comparing and filtering unit 130 may include a comparator and a filter as illustrated and explained in FIG. 2. The comparator may output a signal based on a comparison between the indication 128 and the comparison count. The filter may filter the signal and thereby integrate the comparison between the indication 128 and the comparison count.

Based on the integration of the comparisons of the indication 128 with the comparison count over a period, the comparing and filtering unit 130 may adjust the adjust signal 132 to thereby adjust the duty cycle of the adjusted oscillating signal 112. By adjusting the duty cycle of the adjusted oscillating signal 112, the indication 128 may be changed until the indication 128 stabilizes at or dithers around the comparison count in the comparing and filtering unit 130. After the indication 128 stabilizes at or dithers around the comparison count, the comparing and filtering unit 130 may be configured to stop adjusting the adjust signal 132 to maintain the duty cycle of the adjusted oscillating signal 112.

In some embodiments, the comparing and filtering unit 130 may be clocked with a divided clock signal 144 provided by the divider 142. In these and other embodiments, the divider 142 may divide the clock signal 140 and provide the divided clock signal 144 to the comparing and filtering unit 130. As a result, the comparing and filtering unit 130 may be clocked slower than the sampling rate of the sampling unit 122. Additionally, the comparing and filtering unit 130 may be clocked slower than the oscillating rate of the oscillating signal 108. Having the comparing and filtering unit 130 clocked slower than the oscillating rate of the oscillating signal 108 may allow for more freedom and less complexity when designing the comparing and filtering unit 130. Alternately or additionally, having the comparing and filtering unit 130 clocked slower than the oscillating rate of the oscillating signal 108 may reduce power requirements of the comparing and filtering unit 130. In these and other embodiments, the rate of the divided clock signal 144 may determine a bandwidth of the circuit 100, e.g., how fast the circuit 100 reacts to and corrects changes in the duty cycle of the oscillating signal 108.

The circuit 100 may operate to adjust the duty cycle of the adjusted oscillating signal 112 by adjusting the adjust signal 132. The adjust signal 132 may be adjusted by adjusting the duty cycle modify signal 150. During operation, the circuit 100 may stabilize such that the adjusted oscillating signal 112 has a duty cycle that may cause the indication 128 to stabilize at or dither around the comparison count in the comparing and filtering unit 130. When the duty cycle modify signal 150 is adjusted, the counting unit 126 may ignore the sampling signal 124 periodically and either increase or decrease the indication 128. As a result, the indication 128 may differ from the comparison count. When the indication 128 differs from the comparison count, the comparing and filtering unit 130 may adjust the adjust signal 132 as described above. The adjusted adjust signal 132 may change the duty cycle of the adjusted oscillating signal 112 until the indication 128 stabilizes at or dithers around the comparison count in the comparing and filtering unit 130.

An example of the operation of the circuit 100 follows. Assume that the duty cycle of the oscillating signal 108 is 45% and the count of the counting unit 126 has a range between 0 and 63 and is initially set at the middle of the range, e.g., 31. In this example, the desired duty cycle of the adjusted oscillating signal may be 50% such that the duty cycle modify signal 150 is set to 0. The comparison count in the comparing and filtering unit 130 may also be set to the middle of the range of the counting unit 126, e.g., 31.

The adjusted oscillating signal 112 may be sampled by the sampling unit 122. The counting unit 126 may increase the indication 128 when the sample is a high level and may decrease the indication 128 when the sample is a low level. With the duty cycle of the adjusted oscillating signal 112 at approximately 45%, there may be more low-level samples than high-level samples over time. Furthermore, with the duty cycle modify signal 150 being zero, the counting unit 126 may not bias the indication 128. As a result, after a period of time the indication 128 of the counting unit 126 may decrease to be less than 31. The indication 128 at less than 31 may be compared to the comparison count of 31 in the comparing and filtering unit 130. The comparing and filtering unit 130 may adjust the adjust signal 132, based on the accumulation of the comparisons between the indication 128 and the comparison count, to cause the adjustment unit 110 to extend the high levels and compress the low levels of the oscillating signal 108 to bring the duty cycle of the adjusted oscillating signal 112 closer to 50%. The circuit 100 may continue this feedback process until the duty cycle of the adjusted oscillating signal 112 approximates or equals the desired duty cycle of 50%. After the duty cycle of the adjusted oscillating signal 112 approximates or equals the desired duty cycle of 50%, the indication 128 may stabilize at or dither around the middle value of the counting unit 126, e.g., 31, which may be the same as the comparison count in the comparing and filtering unit 130. As a result, the adjust signal 132 may stabilize and maintain the duty cycle of the adjusted oscillating signal 112 at 50%.

Another example of the operation of the circuit 100 follows. Assume that the duty cycle of the oscillating signal 108 is 50% and the count of the counting unit 126 has a range between 0 and 255 and is initially set at the middle of the range, e.g., 127. In this example, the desired duty cycle of the adjusted oscillating signal may be approximately 48% such that the duty cycle modify signal 150 is set to a non-zero number that may cause the counting unit 126 to increase the count every 32 cycles of the clock. Additionally, the comparison count in the comparing and filtering unit 130 may be set to the middle of the range of the counting unit 126, e.g., 127.

The adjusted oscillating signal 112 may be sampled by the sampling unit 122. The counting unit 126 may increase the indication 128 when the sample is a high level and may decrease the indication 128 when the sample is a low level. Additionally, every 32 cycles, the counting unit 126 may ignore the sampling signal 124 and increase the indication 128 by 1. As a result, after a period, the indication 128 of the counting unit 126 may increase to be more than 127. The indication 128 at more than 127 may be compared to the comparison count of 127 in the comparing and filtering unit 130. The comparing and filtering unit 130 may adjust the adjust signal 132, based on the accumulation of the comparisons between the indication 128 and the comparison count, to cause the adjustment unit 110 to compress the high levels and extend the low levels of the oscillating signal 108 to bring the duty cycle of the adjusted oscillating signal 112 closer to 48%. As a result, for every 128 cycles, the indication 128 is updated for 124 cycles based on the sampling signal 124 and updated for 4 cycles by the bias applied by the counting unit 126 resulting from the duty cycle modify signal 150.

After some time, during 60 cycles of the 124 cycles where the indication 128 is updated based on the sampling signal 124, the sampling signal 124 may indicate that the adjusted oscillating signal 112 is a high level such that the counting unit 126 increases the indication 128. Additionally, during 64 cycles of the 124 cycles where the indication 128 is updated based on the sampling signal 124, the sampling signal 124 may indicate that the adjusted oscillating signal 112 is a low level such that the counting unit 126 may decrease the indication 128. The adjusted oscillating signal 112 being sampled at a high level 60 times of 124 samples may indicate that the duty cycle of the adjusted oscillating signal 112 is 60/124 or approximately 48%. However, due to the biasing applied by the counting unit 126, the indication 128 provided to the comparing and filtering unit 130 may be stable or dither around 127. Because the indication 128 stabilizes or dithers around 127, which is equal to the comparing count of the comparing and filtering unit 130, the comparing and filtering unit 130 may stop adjusting the adjust signal 132 so that the duty cycle of the adjusted oscillating signal 112 maintains at approximately 48%.

Modifications, additions, or omissions may be made to the circuit 100 without departing from the scope of the present disclosure. For example, the circuit 100 may not include the divider 142. In these and other embodiments, the divided clock signal 144 may be provided from another source and not from the divider 142. Alternately or additionally, the comparing and filtering unit 130 may be clocked by the clock signal 140.

Figure 2:
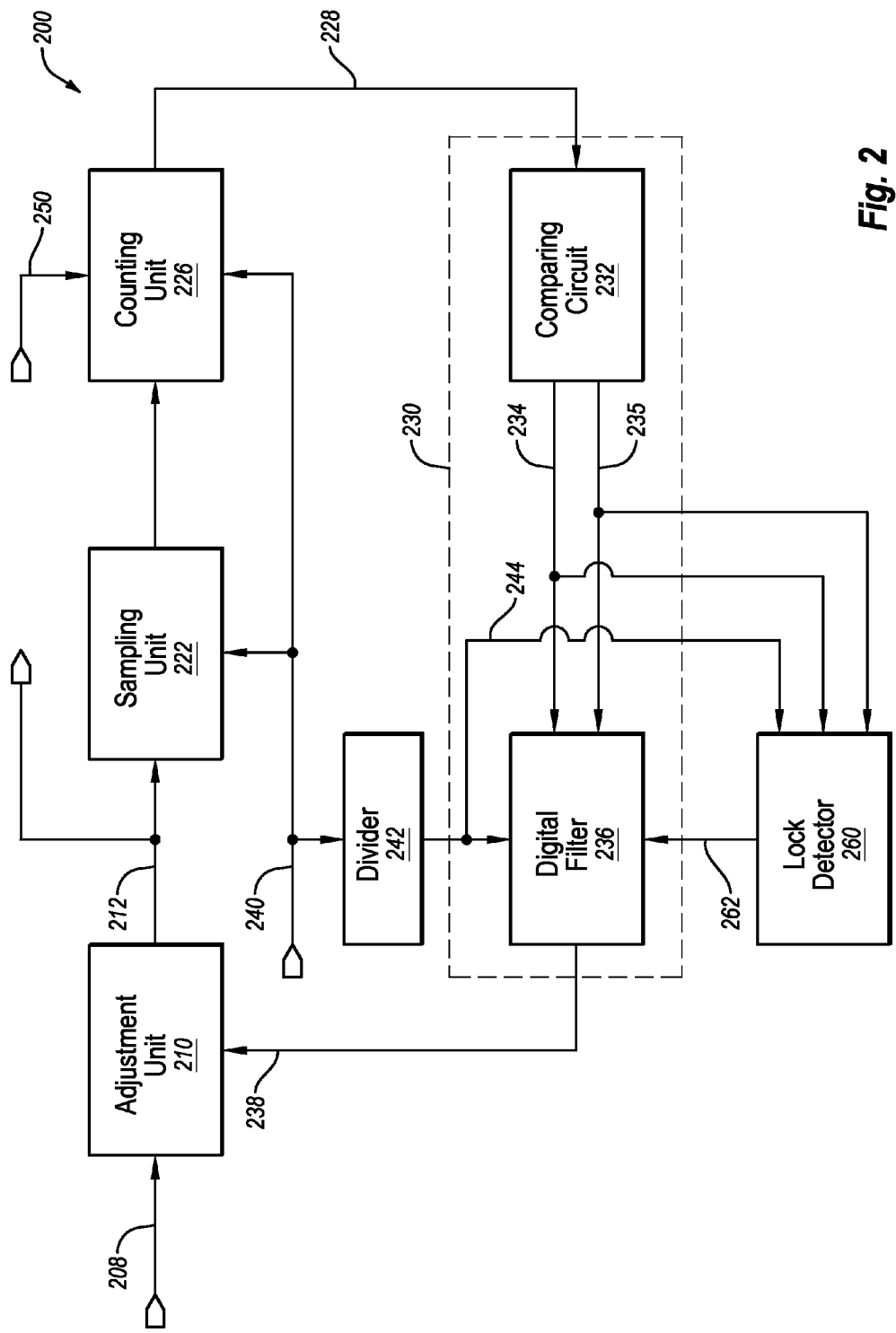
FIG. 2 is a block diagram of another example digital duty-cycle correction circuit.

FIG. 2 is a block diagram of another example digital duty-cycle correction circuit 200 ("the circuit 200"), arranged in accordance with at least one embodiment described herein. The circuit 200 may be configured to adjust a duty cycle of an oscillating signal 208 to generate an adjusted oscillating signal 212 that has a desired duty cycle.

The circuit 200 may include an adjustment unit 210, a sampling unit 222, a counting unit 226, a comparing and filtering unit 230, a divider 242, and a lock detector 260. The adjustment unit 210, the sampling unit 222, the counting unit 226, and the divider 242 may be analogous to the adjustment unit 110, the sampling unit 122, the counting unit 126, and the divider 142 of FIG. 1. As a result, no further explanation of these components of the circuit 200 is provided with respect to FIG. 2.

The comparing and filtering unit 230 may include a comparing circuit 232 and a digital filter 236. The comparing circuit 232 may be configured to compare an indication 228 from the counting unit 226 with a comparison count, which may depend on a counting range of the counting unit 226.

The comparing circuit 232 may be further configured to assert a first signal 234 when the indication 228 is more than the comparison count and to assert a second signal 235 when the indication 228 is less than the comparison count. Asserting the first and second signals 234 and 235 may indicate that the first and second signals 234 and 235 are brought to a high level, a low level, or where one is brought to the high level and the other is brought to the low level. The comparing circuit 232 may send the first and second signals 234 and 235 to the digital filter 236 and to the lock detector 260.

The digital filter 236 may be configured to generate an adjust signal 238 based on the first and second signals 234 and 235. In particular, the digital filter 236 may be configured to scale and/or integrate the first and second signals 234 and 235 to generate the adjust signal 238. In FIG. 2, the digital filter 236 is clocked by a divided clock signal 244 generated by the divider 242 dividing a clock signal 240 used to clock the sampling unit 222 and the counting unit 226. As a result, the digital filter 236 may be clocked slower than a sampling rate of the sampling unit 222. Alternately or additionally, the bandwidth of the circuit 200 may be based on the clock rate of the divided clock signal 244.

The lock detector 260 may be clocked by the divided clock signal 244 and may be configured to receive the first and second signals 234 and 235. The lock detector 260 may be further configured to generate a locking signal 262 based on the first and second signals 234 and 235. In particular, the lock detector 260 may be configured to generate the locking signal 262 when the first and second signals 234 and 235 indicate that the duty cycle of the adjusted oscillating signal 212 approximates the desired duty cycle indicated by the duty cycle modify signal 250. The first and second signals 234 and 235 may indicate that the duty cycle of the adjusted oscillating signal 212 approximates the desired duty cycle when the comparing circuit 232 asserts each of the first and second signals 234 and 235 an approximately equal number of times over a period.

The lock detector 260 may send the locking signal 262 to the digital filter 236. The digital filter 236 may be configured to lock the adjust signal 238, such that the digital filter 236 does not continue to adjust the adjust signal 238 based on the first and second signals 234 and 235. In these and other embodiments, having the adjust signal 238 locked may reduce jitter of the adjusted oscillating signal 212 resulting from dithering in the indication 228. The dithering in the indication 228 from the counting unit 226 may be due to the count of the counting unit 226 changing back and forth between two numbers as the sampling unit 222 samples a high level and then a low level.

In some embodiments, when the digital filter 236 is locked, the sampling unit 222, the counting unit 226, and the comparing circuit 232 may be disabled to reduce power consumption of and noise generated by the circuit 200. Alternately or additionally, when the lock detector 260 asserts the locking signal 262, another device may supply the adjust signal 238 to allow everything but the adjustment unit 210 of the circuit 200 to be disabled. Other modifications, additions, or omissions may be made to the circuit 200 without departing from the scope of the present disclosure.

Figure 3:
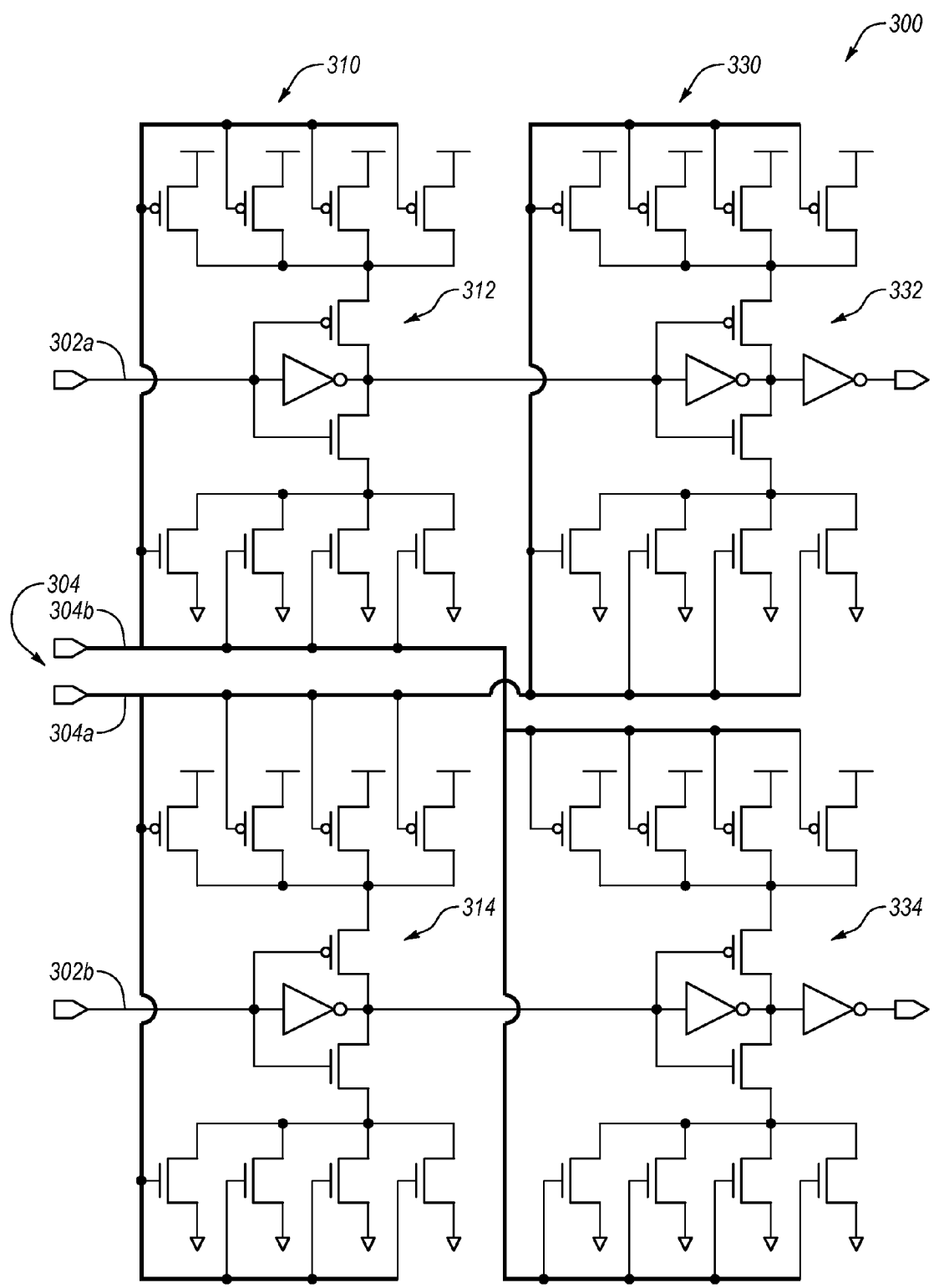
FIG. 3 is a circuit diagram of an adjustment circuit for adjusting a duty cycle of an oscillating signal.

FIG. 3 is a circuit diagram of an adjustment unit 300 for adjusting a duty cycle of an oscillating signal 302 (including components 302a and 302b), arranged in accordance with at least one embodiment described herein. In particular, FIG. 3 illustrates an adjustment unit 300 that may be used to adjust a duty cycle of the oscillating signal 302 based on an adjust signal 304 (including components 304a and 304b) where the oscillating signal 302 is a differential signal that includes oscillating signal A 302a and oscillating signal B 302b. In particular, the adjustment unit 300 may be configured to adjust the duty cycle of the oscillating signal 302 using a non-inverted adjust signal 304a and an inverted adjust signal 304b that collectively form the adjust signal 304. The adjustment unit 300 of FIG. 3 is an example embodiment of the adjustment units 110 and 210 of FIGS. 1 and 2.

The adjustment unit 300 may be configured to adjust the duty cycle of the oscillating signal 302 by extending or compressing the oscillating signal 302 using first and second stages 310 and 330. The first stage 310 may include a first inverting circuit 312 that inverts the oscillating signal A 302a and a second inverting circuit 314 that inverts the oscillating signal B 302b. The second stage 330 may include a third inverting circuit 332 that inverts the oscillating signal A 302a and a fourth inverting circuit 334 that inverts the oscillating signal B 302b. Each of the inverting circuits 312, 314, 332, and 334 may include a bank of p-type metal oxide semiconductor (PMOS) transistors tied to a voltage and a bank of n-type metal oxide-semiconductors (NMOS) transistors tied to ground.

As an example, the adjustment unit 300 may compress the oscillating signal 302 by pulling the oscillating signal 302 stronger to the voltage than to ground during the first stage 310 and pulling the oscillating signal 302 stronger to ground than to the voltage during the second stage 330. The amount that the adjustment unit 300 pulls the oscillating signal 302 may be varied by adjusting the number of PMOS and NMOS transistors in the first and second stages 310 and 330 that conduct at one time. For example, the adjust signal 304 may be configured to cause one, two, three, or all four of the transistors of the banks of PMOS or NMOS transistors to conduct. The more transistors that conduct, the larger the pull on the oscillating signal 302.

Modifications, additions, or omissions may be made to the adjustment unit 300 without departing from the scope of the present disclosure. For example, each bank of transistors may have more than four transistors. For example, each bank may have 4, 8, 10, 12, 16, 32, or some other number of transistors. More transistors may allow for a better granularity of duty cycle adjustment. For example, to change the duty cycle of the oscillating signal 302 by 1% steps, more transistors would be used that each conduct less than the number of transistors that may be used to change the duty cycle of the oscillating signal 302 by 5% steps.

Figure 4:
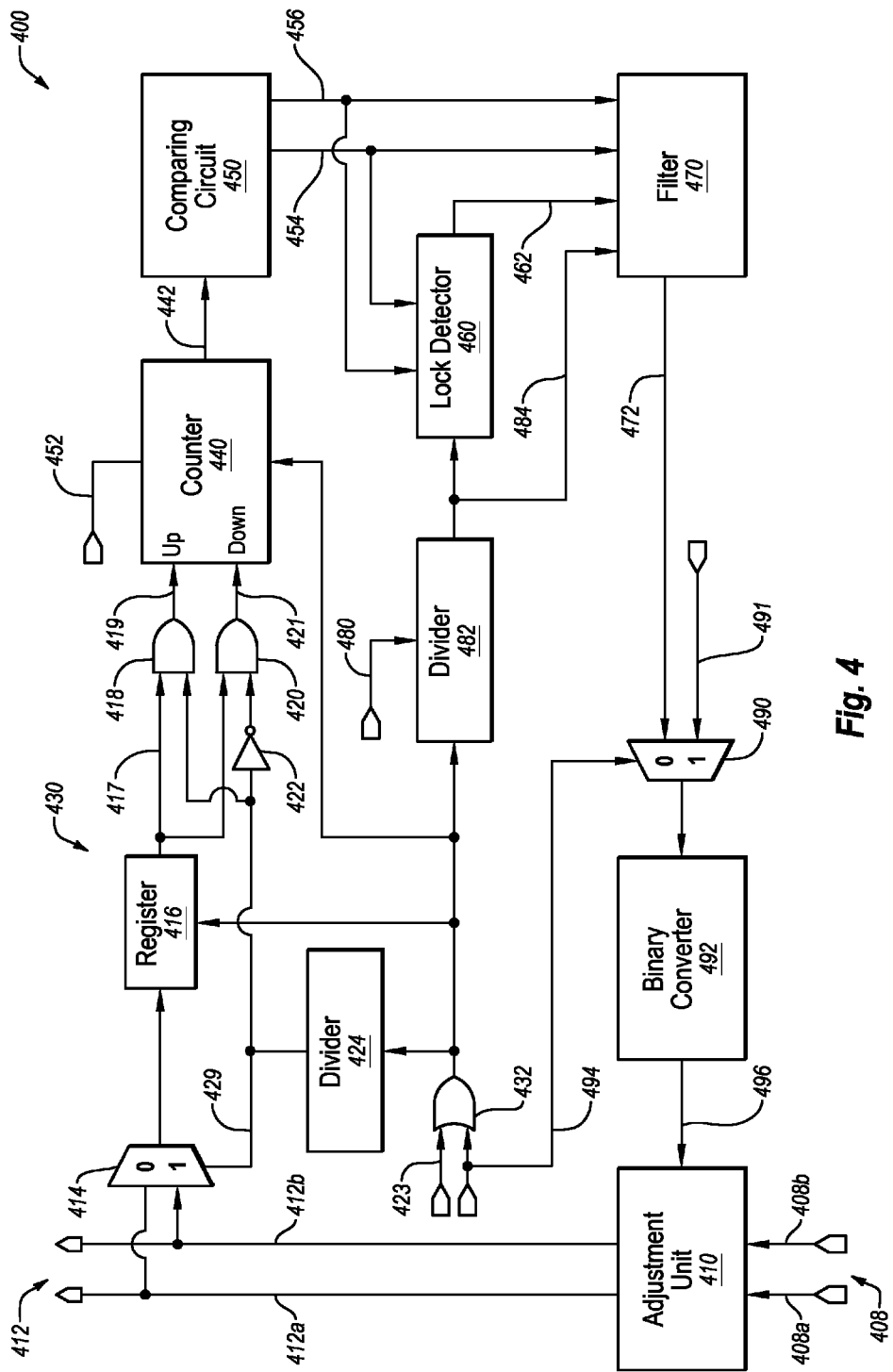
FIG. 4 is a circuit diagram of another example digital duty-cycle correction circuit.

FIG. 4 is a circuit diagram of another example digital duty-cycle correction circuit 400 ("the circuit 400"), arranged in accordance with at least one embodiment described herein. The circuit 400 may be configured to adjust a duty cycle of an oscillating signal 408 (including components 408a and 408b) to generate an adjusted oscillating signal 412 (including components 412a and 412b) that has a desired duty cycle.

The oscillating signal 408 may be a differential signal that includes a signal pair that may include an oscillating signal A 408a and an oscillating signal B 408b. The adjusted oscillating signal 412 may also be a differential signal that includes a signal pair that includes an adjusted oscillating signal A 412a and an adjusted oscillating signal B 412b.

The circuit 400 may include an adjustment unit 410, a first multiplexer 414, a register 416, a first AND gate 418, a second AND gate 420, an inverter 422, a first divider 424, an OR gate 432, a counter 440, a comparing circuit 450, a lock detector 460, a digital filter 470, a second divider 482, a second multiplexer 490, and a binary converter 492.

The oscillating signal 408 may be received by the adjustment unit 410. The adjustment unit 410 may include the adjustment unit 300 of FIG. 3, for example. The adjustment unit 410 may be configured to adjust the duty cycle of the oscillating signal 408 based on a converted adjust signal 496 provided to the adjustment unit 410 by the binary converter 492. The converted adjust signal 496 may indicate to the adjustment unit 410 how much to adjust the duty cycle of the oscillating signal 408. The adjustment unit 410 may output the adjusted oscillating signal 412.

The OR gate 432 may be configured to receive a clock signal 423 and a bypass signal 494. The clock signal 423 is configured to be non-synchronous with the adjusted oscillating signal 412 such that the rising and falling edges of the clock signal 423 are uncorrelated with the rising and falling edges of the adjusted oscillating signal 412. Furthermore, the clock signal 423 may have a lower frequency than the frequency of the adjusted oscillating signal 412. The clock signal 423 or a division of the clock signal 423 may be used to clock various components of the circuit 400.

The bypass signal 494 may be used by the circuit 400 to provide the converted adjust signal 496 to the adjustment unit 410 without operating the majority of the components of the circuit 400. For example, the bypass signal 494 may be asserted at a high level. At a high level, the OR gate 432 outputs a high level regardless of the level of the clock signal 423. As a result, the components in the circuit 400 that are clocked by the clock signal 423 or a division of the clock signal 423 are not clocked and do not operate. Furthermore, the bypass signal 494 may be provided to the second multiplexer 490. A high level being provided to the second multiplexer 490 may cause the second multiplexer 490 to select a set adjust signal 491 upon which the converted adjust signal 496 is based instead of an adjust signal 472 from the digital filter 470. When the bypass signal 494 is asserted low, the OR gate 432 may pass the clock signal 423 without altering the clock signal 423. The clock signal 423 may be used to clock the register 416 and the counter 440.

The clock signal 423 may also be divided by the first divider 424 and the second divider 482. The first divider 424 may divide the clock signal 423 by two to generate a first divided clock signal 429. The second divider 482 may divide the clock signal 423 by a varying number that is based on a dividing signal 480 received by the second divider 482. Based on the dividing signal 480, the second divider 482 may divide the clock signal 423 to generate a second divided clock signal 484.

The first divided clock signal 429, the first multiplexer 414, the register 416, the inverter 422, and the first and second AND gates 418 and 420 may be referred to collectively as the sampling components 430 and may be configured to sample the adjusted oscillating signal 412 and provide the samples to the counter 440. In particular, the sampling components 430 may operate to assert a first AND gate output signal 419 that may represent a high-level sample of the adjusted oscillating signal 412 and to assert a second AND gate output signal 421 that may represent a low-level sample of the adjusted oscillating signal 412. With the adjusted oscillating signal 412 being a differential signal, the low-level sample of the adjusted oscillating signal 412 may be a high-level sample of the inverted signal of the differential signal. In the circuit 400, the second AND gate output signal 421 may be the high-level sample of the inverted signal, which may be the adjusted oscillating signal B 412b of the adjusted oscillating signal 412.

The sampling components 430 may operate to provide the first and second AND gate output signals 419 and 421 to the counter 440 as follows. The first multiplexer 414 may be clocked by the first divided clock signal 429. When the first divided clock signal 429 is at a high level, the first multiplexer 414 may provide the adjusted oscillating signal B 412b to the register 416. When the first divided clock signal 429 is at a low level, the first multiplexer 414 may provide the adjusted oscillating signal A 412a to the register 416.

The register 416 may be configured to sample its input at a rising edge of the clock signal 423. Because the first divided clock signal 429 is twice as slow as the clock signal 423 and offset from the clock signal 423 due to the delay of the first divider 424, the register 416 alternates between sampling the adjusted oscillating signal A 412a and the adjusted oscillating signal B 412b at the rising edge of the clock signal 423. The register 416 may provide the sample as a sampled signal 417 to the first and second AND gates 418 and 420. With the register 416 sampling both the adjusted oscillating signal A 412a and the adjusted oscillating signal B 412b, the circuit 400 may avoid consequences, such as voltage offset differences of signals, resulting from varying threshold voltages when separate registers are used to sample the adjusted oscillating signal A 412a and the adjusted oscillating signal B 412b.

The first AND gate 418 receives the sampled signal 417 at one input and the first divided clock signal 429 at another input. The first AND gate 418 asserts the first AND gate output signal 419 when the sampled signal 417 is at a high level and the first divided clock signal 429 is at a high level. As a result, the assertion of the first AND gate output signal 419 may represent a high level of the sample of the adjusted oscillating signal A 412a.

The second AND gate 420 receives the sampled signal 417 at one input and an inversion of the first divided clock signal 429 generated by the inverter 422 at another input. As a result, the second AND gate 420 may assert the second AND gate output signal 421 when the sampled signal 417 is at a high level and the first divided clock signal 429 is at a low level due to the first divided clock signal 429 being inverted by the inverter 422. As a result, the assertion of the second AND gate output signal 421 may represent a high level of the sample of the adjusted oscillating signal B 412b.

The counter 440 may be configured to increase its count when the first AND gate output signal 419 is asserted and to decrease its count when the second AND gate output signal 421 is asserted. The counter 440 may be configured as a saturating counter so that it does not roll over. In some embodiments, the counter 440 may be reset to be at a middle value of the counter 440 when the circuit 400 begins to operate. The counter 440 may output its count as a count signal 442.

The counter 440 may also be configured to bias the count signal 442 based on a duty cycle modify signal 452 that is based on a desired duty cycle of the adjusted oscillating signal 412. The duty cycle modify signal 452 may determine an amount that the count signal 442 is biased and whether the count signal 442 is biased by being increased or decreased. The count signal 442 may be biased by the counter 440 adjusting the count signal 442 at a selected interval based on the duty cycle modify signal 452 instead of adjusting the count signal 442 based on when the first and second AND gate output signals 419 and 421 are asserted. To increase the bias of the count signal 442, the selected interval at which the counter 440 adjusts the count signal 442 may be increased. In one example, the duty cycle modify signal 452 may be a four-digit binary number. One digit of the duty cycle modify signal 452 may indicate whether to increase or decrease the count signal 442. The other three digits may indicate intervals for the counter 440 to adjust the count signal 442. The duty cycle modify signal 452 in other embodiments may be more or less than a four digit binary number or some other type of number.

The comparing circuit 450 may compare the count signal 442 with a comparison count that is based on a counting range of the counter 440 and a value at which the counter 440 resets. The comparing circuit 450 may be further configured to assert a first signal 454 when the count signal 442 is more than the comparison count and to assert a second signal 456 when the count signal 442 is less than the comparison count. The comparing circuit 450 may send the first and second signals 454 and 456 to the digital filter 470 and to the lock detector 460.

The lock detector 460 may be clocked by the second divided clock signal 484 and may be configured to receive the first and second signals 454 and 456. The lock detector 460 may be further configured to generate a locking signal 462 when the first and second signals 454 and 456 indicate that the duty cycle of the adjusted oscillating signal 412 approximates the desired duty cycle indicated by the duty cycle modify signal 452. The first and second signals 454 and 456 may indicate that the duty cycle of the adjusted oscillating signal 412 approximates the desired duty cycle when the comparing circuit 450 asserts each of the first and second signals 454 and 456 an approximately equal number of times over a period.

The digital filter 470 may be clocked by the second divided clock signal 484 and may be configured to generate an adjust signal 472 based on the first and second signals 454 and 456. In particular, the digital filter 470 may be configured to scale and/or integrate the first and second signals 454 and 456 to generate the adjust signal 472. The digital filter 470 may also receive the locking signal 462. Based on the locking signal 462, the digital filter 470 may be configured to lock the adjust signal 472, such that the digital filter 470 does not continue to adjust the adjust signal 472 based on the first and second signals 454 and 456.

The adjust signal 472 may be provided to the second multiplexer 490. The second multiplexer 490 may be configured to select the adjust signal 472 to provide to the binary converter 492 when the bypass signal 494 is not asserted. The second multiplexer 490 may also be configured to select the set adjust signal 491 to provide to the binary converter 492 when the bypass signal 494 is asserted. The set adjust signal 491 may be based on the adjust signal 472 when the lock detector 460 asserts the locking signal 462. Alternately or additionally, the set adjust signal 491 may be selected based on other criteria.

The binary converter 492 may be configured as a binary-to-thermometer decoder. In these and other embodiments, the set adjust signal 491 and the adjust signal 472 may both be binary numbers. The binary converter 492 may convert the set adjust signal 491 or the adjust signal 472 to a unary code. The unary code of the set adjust signal 491 or the adjust signal 472 may be provided to the adjustment unit 410 as the converted adjust signal 496.

Modifications, additions, or omissions may be made to the circuit 400 without departing from the scope of the present disclosure. For example, in some embodiments, the circuit 400 may not include the binary converter 492. Alternately or additionally, the circuit 400 may not include the lock detector 460, the second divider 482, and/or the bypass signal 494.

When the bypass signal 494 is not included, the OR gate 432 and the second multiplexer 490 may not be included. In other embodiments, the binary converter 492 may be replaced by a Digital to Analog Converter (DAC) and the converted adjust signal 496 may be an analog current such that the adjustment unit 410 may adjust the duty cycle based on the analog current received from the DAC.

Figure 5:
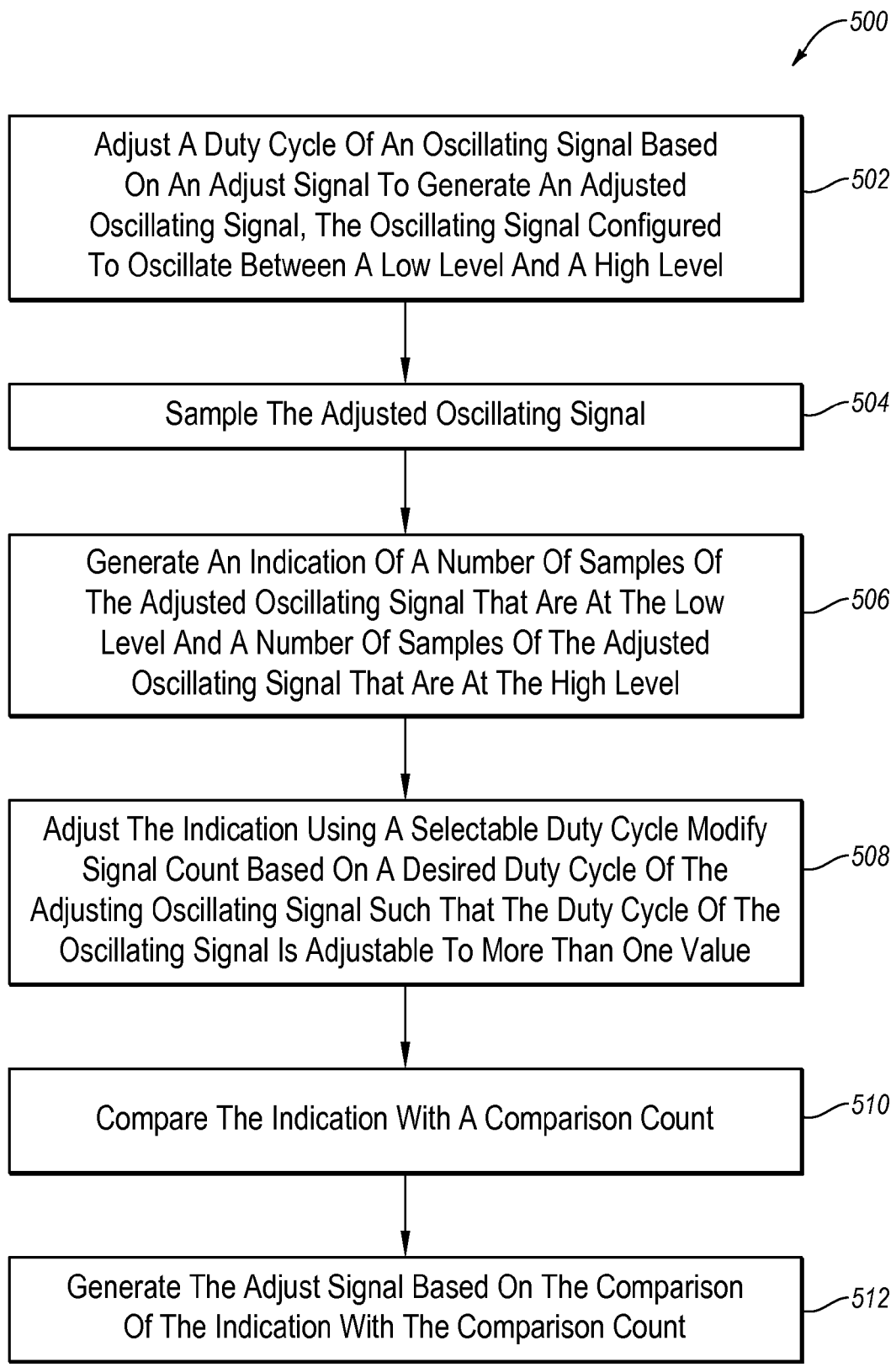
FIG. 5 is a flowchart of an example method of correcting a duty cycle of an oscillating signal.

FIG. 5 is a flowchart of an example method 500 of correcting a duty cycle of an oscillating signal, arranged in accordance with at least one embodiment described herein. The method 500 may be implemented, in some embodiments, by a circuit, such as the circuits 100, 200, and/or 400 of FIGS. 1, 2, and 4, respectively. Although illustrated as discrete blocks, various blocks may be divided into additional blocks, combined into fewer blocks, or eliminated, depending on the desired implementation.

The method 500 may begin at block 502, where a duty cycle of an oscillating signal may be adjusted based on an adjust signal to generate an adjusted oscillating signal. The oscillating signal may be configured to oscillate between a low level and a high level.

In block 504, the adjusted oscillating signal may be sampled. In some embodiments, the oscillating signal may be a differential clock signal that includes first and second complementary signals. In these and other embodiments, sampling the level of the adjusted oscillating signals may include sampling the level of the adjusted first and second complementary signals. In some embodiments, the adjusted oscillating signal may be sampled at a sampling rate that is lower than an oscillating rate of the adjusted oscillating signal.

In block 506, an indication of a number of samples of the adjusted oscillating signal that are at the low level and a number of samples of the adjusted oscillating signal that are at the high level may be generated.

In block 508, the indication may be adjusted using a selectable duty cycle modify signal based on a desired duty cycle of the adjusting oscillating signal such that the duty cycle of the oscillating signal is adjustable to more than one value.

In block 510, the indication may be compared with a comparison count. In some embodiments, the indication may be a count. In these and other embodiments, when the oscillating signal is a differential clock signal that includes first and second complementary signals, the count may be increased when the adjusted first complementary signal is sampled at the high level and the count being decreased when the adjusted second complementary signal is sampled at the high level.

In block 512, the adjust signal may be generated based on the comparison of the indication with the comparison count.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, the method 500 may further include locking the adjust signal when the duty cycle of the adjusted oscillating signal approximates the desired duty cycle of the adjusting oscillating signal. Alternately or additionally, when the indication is generated by a counter, the method 500 may further include determining the comparison count based on counting range of the counter.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that various changes, substitutions, and alterations could be made hereto without departing from the spirit and scope of the invention.

What is claimed is:

1. A digital duty-cycle correction circuit comprising:
an adjustment unit configured to adjust a duty cycle of an oscillating signal based on an adjust signal to generate an adjusted oscillating signal, the oscillating signal configured to oscillate between a low level and a high level;
a sampling unit configured to sample the adjusted oscillating signal;
a counting unit configured to generate an indication of a number of samples of the adjusted oscillating signal that are at the low level and a number of samples of the adjusted oscillating signal that are at the high level and to adjust the indication using a selectable duty cycle modify signal based on a desired duty cycle of the adjusted oscillating signal such that the duty cycle of the oscillating signal is adjustable to more than one value; and
a comparing and filtering unit configured to generate the adjust signal based on a comparison of the indication with a comparison count.

2. The circuit of claim 1, wherein the oscillating signal is a differential signal that includes first and second complementary signals.

3. The circuit of claim 2, wherein the sampling unit is configured to sample the adjusted first and second complementary signals using a single register.

4. The circuit of claim 3, wherein the indication generated by the counting unit is a count output by the counting unit, the count being increased when the first complementary signal is sampled at the high level and the count being decreased when the second complementary signal is sampled at the high level.

5. The circuit of claim 1, wherein the count stabilizes or dithers around a middle value of the counting unit when the duty cycle of the adjusted oscillating signal is the desired duty cycle.

6. The circuit of claim 1, wherein the sampling unit is configured to sample the adjusted oscillating signal at a sampling rate that is lower than an oscillating rate of the adjusted oscillating signal.

7. The circuit of claim 1, wherein the comparing and filtering unit includes a comparing circuit configured to assert a first signal when the indication is more than the comparison count and to assert a second signal when the indication is less than the comparison count.

8. The circuit of claim 7, wherein the comparing and filtering unit further includes a digital filter coupled to the comparing circuit and configured to generate the adjust signal based on the first and second signals.

9. The circuit of claim 8, wherein the digital filter is clocked slower than a sampling rate of the sampling unit.

10. The circuit of claim 8, further comprising a lock detector circuit configured to generate a locking signal based on the first and second signals when the duty cycle of the adjusted oscillating signal approximates the desired duty cycle and to send the locking signal to the digital filter, the digital filter configured to ignore the first and second signals and to maintain the adjust signal after receiving the locking signal.

11. A digital duty-cycle correction circuit comprising:
an adjustment unit configured to adjust a duty cycle of an oscillating signal based on an adjust signal to generate an adjusted oscillating signal, the oscillating signal configured to oscillate between a low level and a high level;
a sampling unit configured to sample the adjusted oscillating signal;
a counting unit configured to generate an indication of a number of samples of the adjusted oscillating signal that are at the low level and a number of samples of the adjusted oscillating signal that are at the high level and to adjust the indication using a selectable duty cycle modify signal based on a desired duty cycle of the adjusted oscillating signal;
a comparing circuit configured to generate a comparison signal based on a comparison of the indication with a comparison count;
a lock detector configured to determine when the duty cycle of the adjusted oscillating signal approximates the desired duty cycle of the adjusted oscillating signal and to generate a locking signal based on the determination; and
a digital filter configured to generate the adjust signal based on the comparison signal when the locking signal is a first value and to maintain a previously generated adjust signal when the locking signal is a second value.

12. The circuit of claim 11, wherein the digital filter is clocked slower than a sampling rate used by the counting unit to sample the adjusted oscillating signal.

13. The circuit of claim 12, wherein the sampling rate is lower than an oscillating rate of the adjusted oscillating signal.

14. The circuit of claim 12, wherein the adjusted oscillating signal is a differential clock signal that includes adjusted first and second complementary signals and the indication generated by the counting unit is a count output by the counting unit, the count being increased when the adjusted first complementary signal is sampled at the high level, the count being decreased when the adjusted second complementary signal is sampled at the high level, and the count being biased by the duty cycle modify signal.

15. A method of correcting a duty cycle of an oscillating signal, the method comprising:
adjusting a duty cycle of an oscillating signal based on an adjust signal to generate an adjusted oscillating signal, the oscillating signal configured to oscillate between a low level and a high level;
sampling the adjusted oscillating signal;
generating an indication of a number of samples of the adjusted oscillating signal that are at the low level and a number of samples of the adjusted oscillating signal that are at the high level;
adjusting the indication using a selectable duty cycle modify signal based on a desired duty cycle of the adjusted oscillating signal such that the duty cycle of the oscillating signal is adjustable to more than one value;
comparing the indication with a comparison count; and
generating the adjust signal based on the comparison of the indication with the comparison count.

16. The method of claim 15, wherein the adjusted oscillating signal is sampled at a sampling rate that is lower than an oscillating rate of the adjusted oscillating signal.

17. The method of claim 15, wherein the adjusted oscillating signal is a differential clock signal that includes adjusted first and second complementary signals, wherein sampling the level of the adjusted oscillating signal includes sampling the level of the adjusted first and second complementary signals.

18. The method of claim 17, wherein the indication is a count, the count being increased when the adjusted first complementary signal is sampled at the high level and the count being decreased when the adjusted second complementary signal is sampled at the high level.

19. The method of claim 17, wherein the indication is generated by a counter, the method further comprising determining the comparison count based on a counting range of the counter.

20. The method of claim 15, further comprising locking the adjust signal when the duty cycle of the adjusted oscillating signal approximates the desired duty cycle of the adjusted oscillating signal.

* * * * *